(12) United States Patent
Hiroi et al.

(10) Patent No.: US 8,111,902 B2
(45) Date of Patent: Feb. 7, 2012

(54) METHOD AND APPARATUS FOR INSPECTING DEFECTS OF CIRCUIT PATTERNS

(75) Inventors: Takashi Hiroi, Yokohama (JP); Naoki Hosoya, Tokyo (JP); Hirohito Okuda, Yokohama (JP); Koichi Hayakawa, Hitachinaka (JP); Fumihiko Fukunaga, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1290 days.

(21) Appl. No.: 11/488,734

(22) Filed: Jul. 19, 2006

(65) Prior Publication Data

US 2007/0047800 A1 Mar. 1, 2007

(30) Foreign Application Priority Data

Aug. 31, 2005 (JP) .................................. 2005-250518

(51) Int. Cl.
*G06K 9/00* (2006.01)
(52) U.S. Cl. ............ 382/149; 716/52; 716/112; 234/32; 438/12; 700/110
(58) Field of Classification Search .................. 382/149, 382/141
See application file for complete search history.

(56) References Cited

U.S. PATENT DOCUMENTS

| | | | | |
|---|---|---|---|---|
| 4,941,182 A | * | 7/1990 | Patel | 382/141 |
| 5,287,742 A | * | 2/1994 | Aihara et al. | 73/159 |
| 2001/0021020 A1 | * | 9/2001 | Nara et al. | 356/394 |

FOREIGN PATENT DOCUMENTS

| | | |
|---|---|---|
| JP | 03-085742 | 4/1991 |
| JP | 05-258703 | 10/1993 |
| JP | 11-160247 | 6/1999 |
| JP | 2000-161932 | 6/2000 |
| JP | 2000-193594 | 7/2000 |
| JP | 2002-148027 | 5/2002 |
| JP | 2003-006614 | 1/2003 |
| JP | 2003-021605 | 1/2003 |
| JP | 2003-106829 | 4/2003 |
| JP | 2003-515942 | 5/2003 |

* cited by examiner

*Primary Examiner* — John Lee
(74) *Attorney, Agent, or Firm* — Antonelli, Terry, Stout & Kraus, LLP.

(57) ABSTRACT

The present invention relates to a defect inspection apparatus for inspecting defects in patterns formed on a semiconductor device, on the GUI of which for the confirmation of the inspection results an area is provided for displaying any one of or facing each other the features amount of defects, and the image during inspection or the reacquired image, and on the GUI of which a means is provided for setting the classification class and importance of the defects, and based on the classification class and the importance of the defects information set by this setting means, the classification conditions or the defect judging conditions are automatically or manually set so that the inspection conditions may be set easily.

12 Claims, 20 Drawing Sheets

FIG.8

| Sensibility and defects judgement condition | |
|---|---|
| Method of comparison | Cell + die |
| Filter for comparison of cell | A |
| Filter for comparison of die | A |
| Threshold value for comparison of cell | 120 |
| Threshold value for comparison of die | 200 |
| Removal of noises for comparison of cell | 2×2 |
| Removal of noises for comparison of die | 3×3 |
| Positioning condition | Method D |
| RIA condition | Method A |

70 Threshold value

FIG.9

| Classification condition | 1 | 2 | 3 | 4 | 5 | 6 | 7 | 8 | 9 | 10 |
|---|---|---|---|---|---|---|---|---|---|---|

| | | | |
|---|---|---|---|
| ■ Classification class | 120 | | |
| ■ Importance | 5.0 | | |
| ■ Area | 0.01 | 0.10 | Inside |
| ■ X projection length | 0.0 | 0.5 | Inside |
| ■ Difference in color shading | -100 | 5 | Inside |
| ■ Background luminosity | 0 | 50 | Outside |
| ■ Defect luminosity | 0 | 60 | Inside |
| ■ Threshold value | 100 | 300 | Inside |
| ■ - | 100 | 300 | Inside |

80 Automatic classification class
81 Importance of class

FIG.10

91 Manual classification class
92 Importance of defect
80 Automatic classification class

| Defect information | | | |
|---|---|---|---|
| Manual classification | 100 | Difference in shading | -30 |
| Importance | 4.0 | Defect light intensity | 100 |
| Automatic classification | 120 | Background light intensity | 130 |
| Detection method | Comparison of cell | Defect structure | 20 |
| | | Background structure | 10 |
| Threshold value for the cell | 200 | | |
| Threshold value for the die | - | | |
| Area | 0.1 | | |
| X projection length | 0.1 | | |
| Y projection length | 0.3 | | |

93 Marginal threshold value

Number of defects

| Code | Symbol | Type of defect | Number of defects | Ratio (%) | Confirmed number | Confirmed ratio (%) |
|---|---|---|---|---|---|---|
| 10 | □ | White defect | 265 | 22.2 | 71 | 23.7 |
| 20 | ◇ | Black defect | 410 | 34.4 | 90 | 30.3 |
| 60 | ■ | Foreign matters | 127 | 10.7 | 18 | 6.0 |
| 80 | ○ | Unopen | 190 | 15.9 | 85 | 28.3 |
| 99 | △ | False report | 200 | 16.8 | 35 | 11.7 |
| Total number | | Total number of defects | 1192 | 100.0 | 300 | 100 |

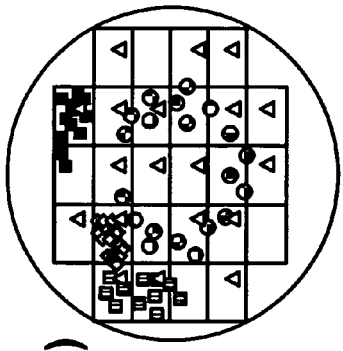

Defect map

FIG.12(A)     FIG.12(B)

Correct classification ratio

| Code | Symbol | Importance | Type of defect | Number of defects | Ratio (%) | Number of correct classification | Ratio of correct classification (%) |
|---|---|---|---|---|---|---|---|
| 10 | □ | 2.0 | White defect | 67 | 22.3 | 60 | 89.5 |
| 20 | ◇ | 2.0 | Black defect | 100 | 33.5 | 90 | 90.0 |
| 60 | ■ | 0.5 | Foreign matters | 13 | 4.3 | 8 | 61.5 |
| 80 | ● | 5.0 | Unopen | 80 | 26.6 | 75 | 93.8 |
| 99 | △ | 1.0 | False report | 40 | 13.3 | 33 | 82.5 |
| Total number | | | Total number of defects | 300 | 100.0 | 266 | 88.7 |

FIG.12(C)

Number of defects

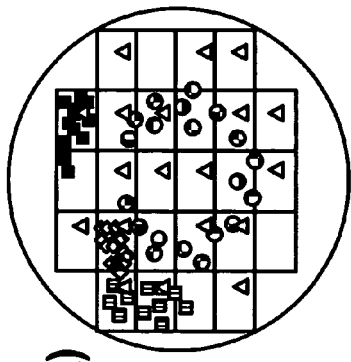

FIG.13(A)
Defect map

FIG.13(B)

| Code | Symbol | Type of defect | Importance | Number of defects | Ratio (%) | Confirmed number | Confirmed ratio (%) |
|---|---|---|---|---|---|---|---|
| 10 | ▪ | White defect | 2.0 | 265 | 22.2 | 71 | 23.7 |
| 20 | ◇ | Black defect | 2.0 | 410 | 34.4 | 90 | 30.3 |
| 60 | ■ | Foreign matters | 0.5 | 127 | 10.7 | 18 | 6.0 |
| 80 | ● | Unopen | 5.0 | 190 | 15.9 | 85 | 28.3 |
| 99 | △ | False report | 1.0 | 200 | 16.8 | 35 | 11.7 |
| Total number | | Total number of defects | | 1192 | 100.0 | 300 | 100 |

Correct classification ratio

FIG.13(C)

| Code | Symbol | Type of defect | Number of defects | 10 | 20 | 60 | 80 | 99 | Ratio of correct classification (%) |
|---|---|---|---|---|---|---|---|---|---|
| 10 | ▪ | White defect | 67 | 60 | 1 | 1 | 3 | 2 | 89.5 |
| 20 | ◇ | Black defect | 100 | 2 | 90 | 2 | 3 | 3 | 90.0 |
| 60 | ■ | Foreign matters | 13 | 1 | 1 | 8 | 2 | 1 | 61.5 |
| 80 | ● | Unopen | 80 | 2 | 0 | 0 | 75 | 3 | 93.8 |
| 99 | △ | False report | 40 | 5 | 0 | 0 | 2 | 33 | 82.5 |
| Purity (%) | | | | 85.7 | 97.8 | 72.7 | 88.2 | 78.6 | 88.7 |

METHOD AND APPARATUS FOR INSPECTING DEFECTS OF CIRCUIT PATTERNS

BACKGROUND OF THE INVENTION

The present invention relates to an inspection apparatus for inspecting substrates on which circuit patterns of a semiconductor device or liquid crystal are formed, and in particular to an art of setting the inspection conditions for inspecting the patterns on the substrate being processed.

A prior optical pattern inspecting apparatus is disclosed for example in Japanese Patent Laid-Open Publication (JP-A) No. Hei 5-258703, while an electronic beam pattern inspecting apparatus is described in JP-A No. Hei 11-160247. Based on these inspecting apparatuses, a system for determining the fatality of defects by classifying defective images (partial images of the areas determined to be defective at the time of inspection) is described in the Japanese Patent Application No. 3132565, a system for storing the images obtained at the time of inspection and determining inspection conditions based on the stored images is described in the JP-A No. 2000-193944, and a system of determining the classification conditions by transferring the defect images to external devices for analysis is described in the Japanese Translation of Unexamined PCT Appln. No. 2003-515942.

And the procedure of setting an inspection recipe is described in the JP-A Nos. 2000-161932, 2003-6614, 2003-21605 and 2003-106829.

SUMMARY OF THE INVENTION

No invention disclosed in JP-A Nos. Hei 5-258703, Hei 11-160247 and Japanese Patent Application No. 3132565 among the prior art described above mentions the conditioning of inspections. And although JP-A No. 2000-19354 and Japanese Translation of Unexamined PCT Appln. No. 2003-515942 describe the method of conditioning, no thorough consideration has been made on the question of whether the defects should be detected or on the credibility of the result because the conditions of classification have been set solely on the basis of the image information obtained at the time of inspection. In addition, considerations have been given only with respect to the sensibility of judging defects and the conditions for classifying defects and not to the question of conditioning for both judgment conditions and defect classification conditions at the same time.

The object of the present invention is to provide a method and an apparatus for inspecting defects of circuit patterns and a method and an apparatus for conditioning for the inspection apparatus wherein it is possible to set inspection conditions including one for the judgment of defects and the classification of defects enabling to improve the performance of detecting the DOI (the defect of interest) desired by the user by making an effective use of defects and their image information acquired by the inspection and other means and the image information of the defects re-acquired by other means.

In other words, in order to realize an inspection apparatus enabling to set the inspection condition for improving the performance of detecting the DOI and the method of determining the conditions for the same, in one aspect, the present invention includes a pattern inspection apparatus composed of a semiconductor device or a pattern inspection method for acquiring circuit pattern images and storing them in a memory as digital images, judging defects from the images stored in the memory, cutting out images of the partial area containing the judged defects, storing the partial area containing the judged defects, storing the information on the feature amount of the defects acquired from the cut-out images and the type and importance of the defects specified by the operators, and for setting the sensibility of judging defects and the condition for classification by the type of defects based on the defects information and the type and importance of the defects.

In addition, in the aspect of the present invention, the pattern inspection apparatus composed of a semiconductor device or the pattern inspection method sets by way of a dialog the sensibility for judging defects and the conditions for classification by the type of defect by acquiring the image of the circuit pattern, storing them in a memory as digital image, judging defects from the image stored in the memory, cutting out the images of the partial area containing the judged defects, selecting any of the defect information acquired from the cut-out images, the image of the partial area containing the defects or the re-acquired image of the image of the circuit pattern and displaying the same, storing the type and importance of the defects specified by the operator based on the displayed information, renewing automatically the sensibility of defect judgment and the classification condition by the type of defect based on the defect information and the type and importance of defects, and renewing the defect information based on the renewed conditions.

According to the aspect of the present invention, it is possible to provide a circuit pattern inspection method and the apparatus thereof or an inspection apparatus condition determining method and the apparatus thereof wherein it is possible to set inspection conditions for improving the performance of detecting DOI (defect of interest) desired by the user by making an effective use of the defects obtained by the inspection or the image information thereof.

These and other objects, features and advantages of the invention will be apparent from the following more particular description of preferred embodiments of the invention, as illustrated in the accompanying drawings.

BRIEF DESCRIPTION OF THE DRAWINGS

In the accompanying drawings,

FIG. 8 is a front view of a screen image for setting the defect judgment conditions;

FIG. 9 is a front view of a screen image for setting the classification conditions;

FIG. 10 is a front view of a screen image for displaying and inputting defect information;

FIG. 12 (A) is an example of displaying on the screen a wafer map showing the distribution of defects in the Report Display Example 1;

FIG. 12 (B) is an example of displaying on the screen a table showing the relations among the types of defect, the number of defects, and the ratio of confirmed defects corresponding to various code in the Report Display Example 1;

FIG. 12 (C) is an example of displaying on the screen a table showing the relations among the types of defect, the number of defects, and the accuracy ratio corresponding to various code in the Report Display Example 1;

FIG. 13 (A) is an example of displaying on the screen image a wafer map showing the distribution of defects in the Report Display Example 2;

FIG. 13 (B) is an example of displaying on the screen map a table showing the relations among the types of defect, the number of defects, and the ratio of confirmed defects corresponding to various code in the Report Display Example 2;

FIG. 13 (C) is an example of displaying on the screen a table showing the relations among the types of defect, the number of defects, and the accuracy ratio corresponding to various code in the Report Display Example 2;

DESCRIPTION OF THE PREFERRED EMBODIMENTS

Figure 1:
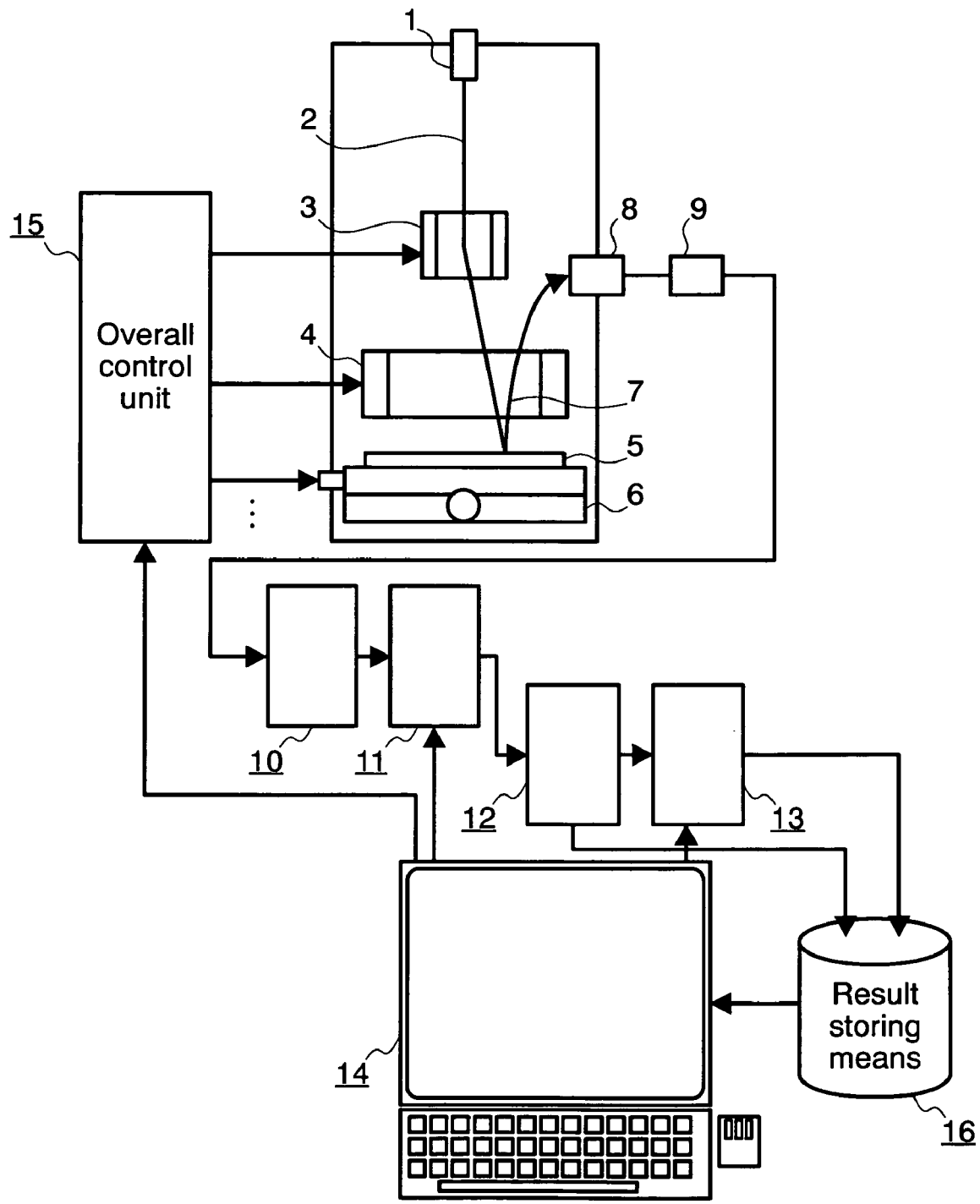
FIG. 1 is a front view showing the schematic configuration of an electron beam inspection apparatus relating to the present invention.

The structure of the first embodiment of the present invention is shown in FIG. 1. FIG. 1 represents an electron beam inspection apparatus. The inspection apparatus includes an electron beam source 1, a deflector 3 for deflecting the electron beam 2 radiating from the electron beam source 1, an objective lens 4 for focusing the electron beam 2, a wafer 5 constituting an object, a stage 6 for superposing the wafer 5, a detector 8 for detecting the secondary electron 7 generated by the electron beam 2 radiated, an A/D converter 9 for converting the detected signals into digital signals, a memory 10 for storing the digital signals as picture images, an image processing unit 11 for processing the stored picture images and judging defects, a partial image memory 12 for storing the partial images cut out based on the coordinates of defects that have been judged, a partial image processing unit 13 for processing the partial images, and a GUI unit 14 having the IF (interface) function with the user, an overall controlling unit 15 for controlling the whole system, and a result storing unit 16 for storing the inspection results or the partial images.

According to the structure mentioned above, the electron beam 2 generated by the electron beam source 1 is deflected by the deflector 3, focused by the objective lens 4 and irradiates and scans the wafer 5 placed on the stage 6. At this time, the area irradiated by the electron beam 2 on the wafer 5 moves relatively as the electron beam 2 scans. The wafer 5 on which the focused electron beam 2 is irradiated and scans generates secondary electron 7. The detection of this secondary electron 7 by the detector 8 synchronizing with the scanning of the electron beam 2 and the conversion of the detected signals by the A/D converter 9 into digital signals enable to obtain digital image signals. The converted digital image signals are stored in the memory 10 and are processed in the image processing unit 11 to extract the defect candidates. The extracted image signals for the defect candidates are stored once in the partial image memory 12 and are processed in the partial image processing unit 13 to extract the real defects, which will then be classified in accordance with the feature quantity (size, area, image contrast and the like) of the defective images. The image processing unit 11 and the partial image processing unit 13 detect defect candidates in accordance with the predetermined inspection conditions, and extract the real defects from among the detected defect candidates to classify the defects. The conditions for detecting the defect candidates and the conditions for classifying the real defects can be set on the GUI unit 14.

Figure 2:
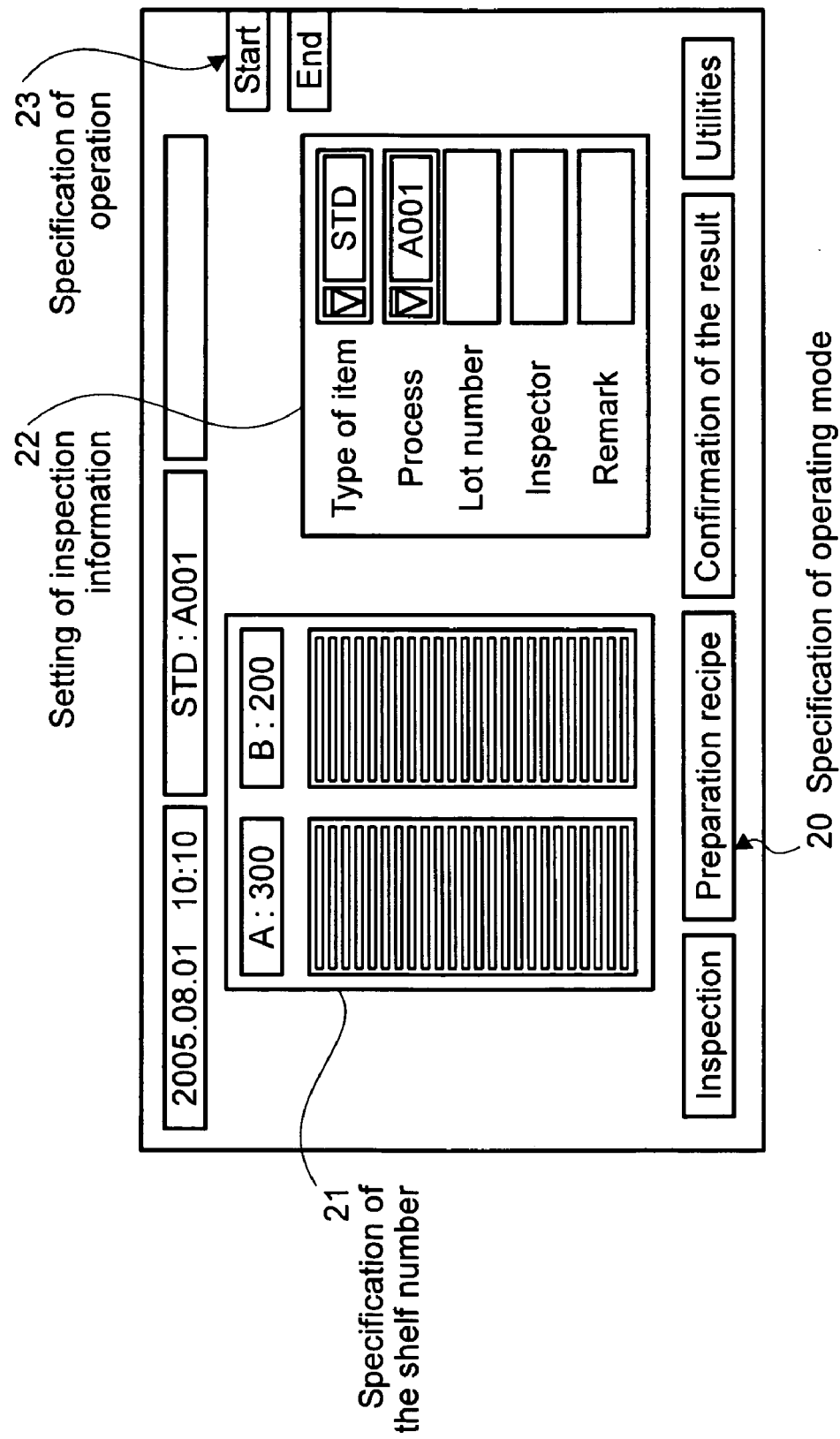
FIG. 2 is a front view of the initial screen image of the GUI.

The initial state of the GUI unit 14 is shown by the initial screen image in FIG. 2. The initial screen image includes an operating mode specifying button 20 for specifying the operating mode of inspection, recipe preparation, confirmation of results, utilities and the like, a shelf number specifying area 21 for specifying the wafer to be inspected or for which a recipe is to be prepared, an inspection information setting area 22 for specifying the inspection information of the wafer to be inspected or for which a recipe is to be prepared, and an operation specifying button 23 for specifying the start or end of the operation. Here, the recipe preparing mode specified by the operating mode specifying button 20 is for confirming the setting and the setting conditions of the layout and the inspection conditions of the wafer 5, the inspection mode is for carrying out the actual inspection by the conditions specified by the recipe preparing mode, the confirmation of result is for confirming the inspection result obtained by the recipe preparing or inspection mode, and the utility is for carrying out other operations.

We will now describe the procedure of setting the inspection recipe according to the structure described above.

To begin with, the wafer 5 serving as an object is placed, the preparation of recipe is specified by the operating mode specifying button 20, the shelf number on which the wafer 5 is placed is specified by the shelf number specifying area 21, the type of item, process and other details of the inspection information are specified in the inspection information setting area 22, and a click on the operation specifying button 23 leads to the start of loading of the wafer 5. Without going into details, the start of loading of the wafer 5 triggers the predetermined loading operation and brings the wafer 5 on the stage 6.

Figure 4:
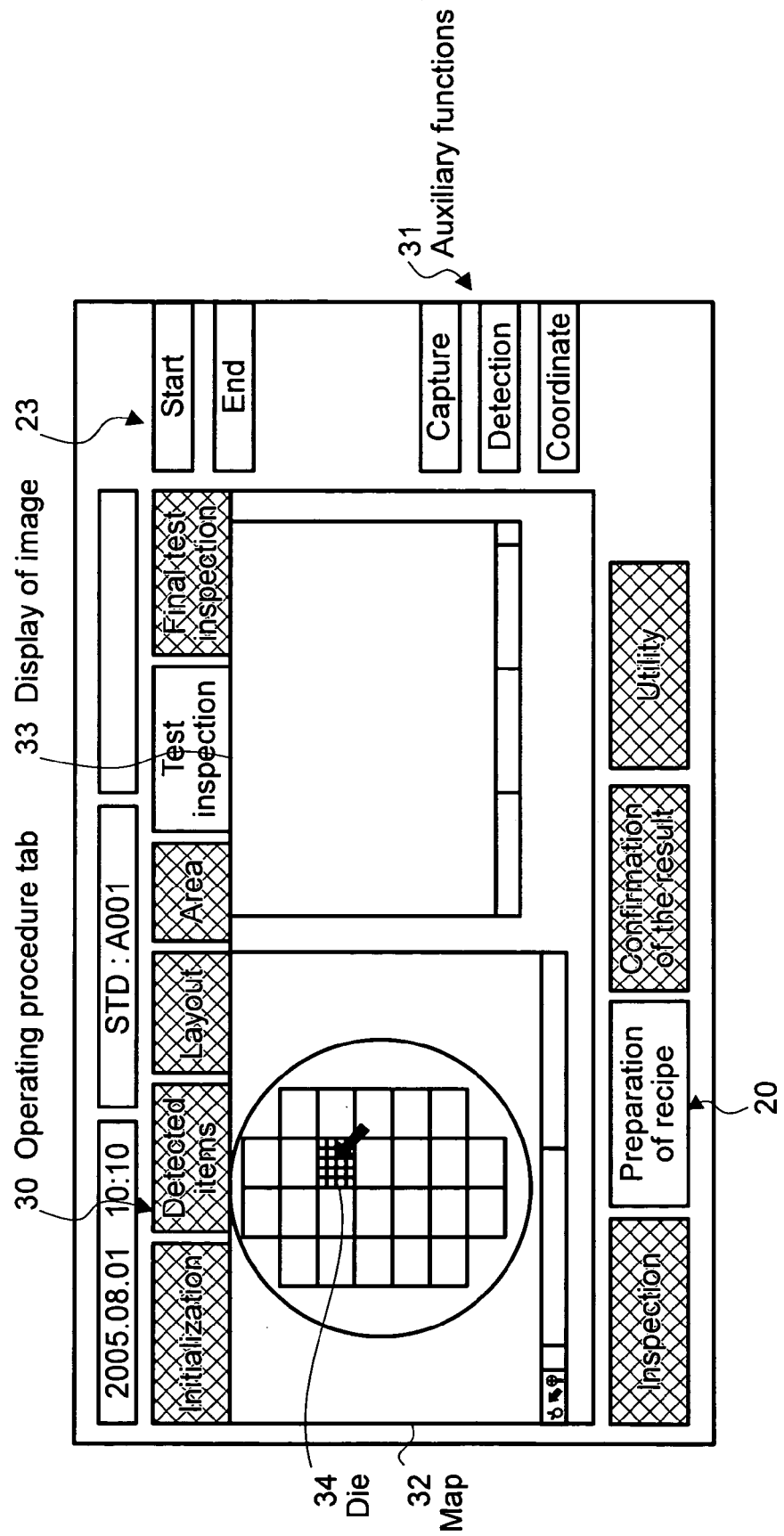
FIG. 4 is a front view of the initial screen image of the test inspection GUI.

When the rearrangement is completed, the screen shifts to the screen image of preparing recipe shown in FIG. 4. The recipe preparing screen displays an operating procedure tab 30 for specifying the operating procedure and an auxiliary function button 31, and a click on the tab allows to choose items to be processed. The auxiliary functions include the function of changing image detecting conditions such as the acquisition of capture images, magnification, number of additions (on the SEM image display, a single scanning over a rectangular area realized by irradiating and scanning electron beam leading to the acquisition of an image of the rectangular area is called "frame," and the acquisition and addition of a plurality of images by the frame enable to display images of a high S/N ratio), and changes in the conditions for detecting images such as the size of pixels, and the coordinate includes the functions of storing and moving the stage coordinates.

The operating procedure tab 30 displays the detection condition setting procedure for setting by way of dialog the irradiating condition of the electron beam 2 and various conditions of the electro-optical system including the deflector 3 and the objective lens 4, the layout specifying procedure for specifying the layout of circuit patterns formed on the wafer 5, the area specifying procedure for specifying the areas to be inspected, the procedure of setting the condition for positioning the patterns of the wafer 5, and the calibration of the detected light intensity, the test inspection procedure for setting the judgment condition for the image processing circuit 11 and the partial image processing apparatus 13, and the area for selecting the final test inspection procedure for confirming and correcting the conditions set in accordance with the test inspection setting procedure.

The operating procedure tab 30 that generally sets according to the setting procedure successively from the left allows a high degree of freedom by allowing changes in the order as required. It stores the detecting conditions, the defect judging conditions, the defect classifying conditions set and having performance confirmed in the recipe preparing mode, and the inspection results used for confirming performance as required in the result storing unit 16.

If the inspection conditions are stored, the shelf numbers stored in the wafer 5 on the initial screen image are specified in the shelf number specifying area 21, the type of item, process and the like are specified in the inspection information setting area 22, the inspection mode is specified by the operating mode specifying button 20, and the start of inspection is specified by the operation specifying button 23. As a result, the detection conditions, the defect judgment conditions, and the defect classification conditions stored under the recipe preparing mode are called, are inspected under the conditions under which they are called and the inspection results are stored. Under the defect confirmation mode, the inspection results stored in the result storing unit 16 under the recipe preparing mode and the inspection mode are specified in the inspection information setting area 22 (detailed items are not shown), the shelf number on which the wafer 5 is placed is specified by the shelf number specifying area 21, the wafer 5 is loaded and the defect information obtained is confirmed.

The details of the procedure of setting the inspection recipe described above are described in the Patent Documents 6-9, and in this embodiment the same procedure as that disclosed in these patent documents is adopted.

Figure 3:
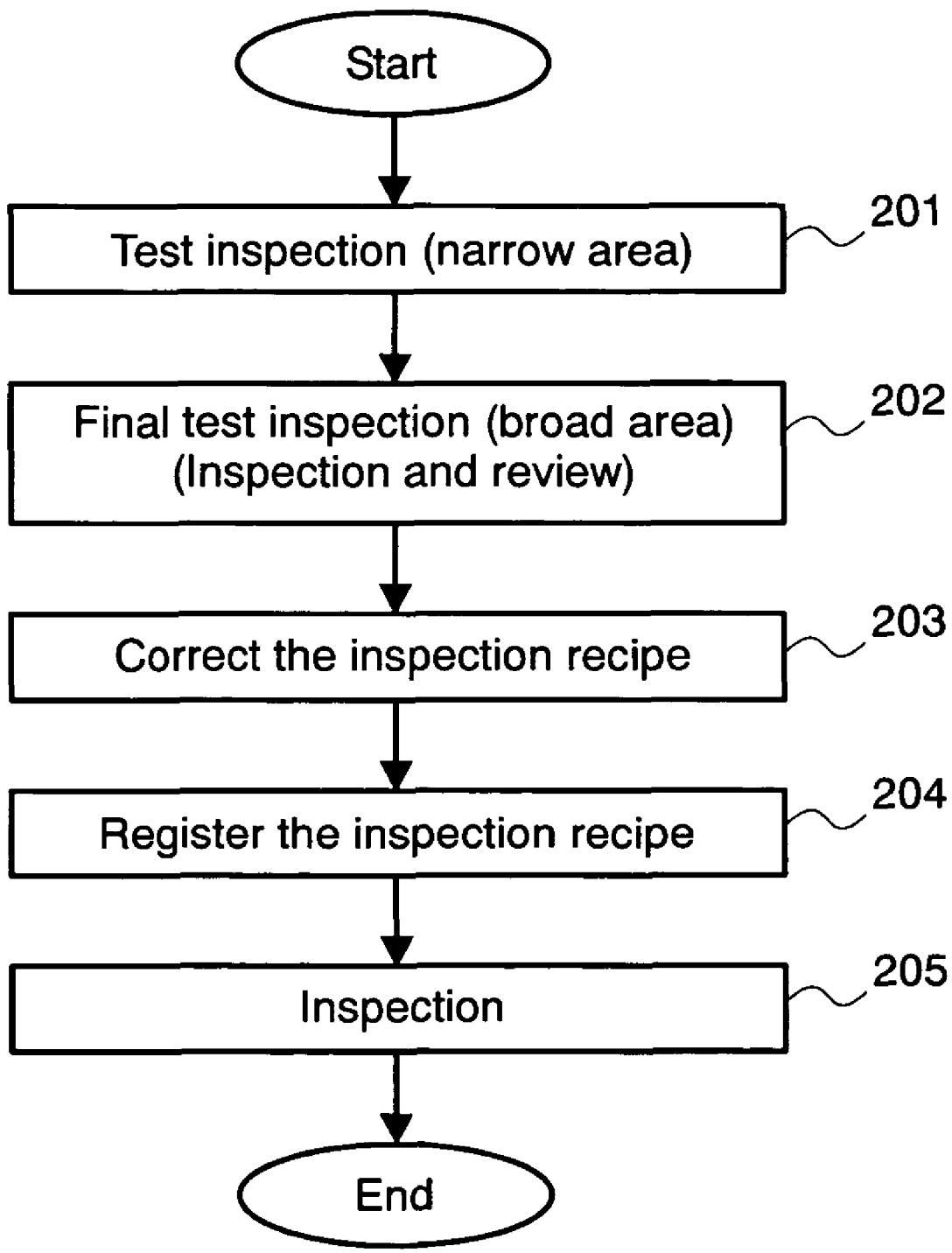
FIG. 3 is a flow diagram showing the whole procedure of inspection.

The electron beam inspection system according to the present invention having the GUI unit 14 described above functions as follows according to the flow diagram shown in FIG. 3.

In the first place, a test inspection is carried out over a relatively narrow area by using the wafer 5 (201), and the recipes for the inspection condition, the defect classification conditions and the like are set. Then, based on the recipes set by inspecting relatively narrow areas in this test inspection (201), the final test inspections (202) are carried out over relatively wide areas, and the detected defects are reviewed. Then, based on the results of this review, the recipes set by the test inspections are corrected as required (203) and are registered (204). In the actual inspection, the data on the wafer 5 are successively inspected by using these registered recipes, to detect and classify the defects (205).

The following is the detailed description of the test inspection (201) and the final test inspection (202).

(1) Test Inspection (201)

FIG. 4 shows the state in which the test inspection procedure has been selected on the GUI. The initial screen image of the test inspection procedure includes a map displaying area 32 showing the wafer 5, and an image display area 33 displaying the image information detected at the position of the current stage 6. The map displayed in the map displaying area 32 can specify the method of display, the magnification of display and the operation mode by selecting successively the rectangular area (button) displayed in the lower part of the map displaying area 32. By clicking on the display method button, it is possible to select one of the wafer mode (the state shown in FIG. 4) indicating the whole wafer, the die mode showing a specific die, and the stripe mode showing the area to be inspected. By clicking on the display magnification button, any optional magnification can be chosen for zooming. By clicking on the operation mode button, it is possible to select any one of a specification mode for specifying die and other items, a moving mode for specifying moving to specified positions, and a magnifying glass mode for changing the magnification. By clicking successively on a plurality of rectangular areas (buttons) displayed in the lower part of the image display area 33, it is possible to specify the magnification of display and to specify the image to be displayed. And by clicking the central button of the mouse of the GUI unit 14 on a specific point of the image displayed in the image display area 33, it is possible to change the area displayed by image in such a way that the specified position may be displayed at the center of the area of displaying the image.

For the displayed image, it is possible to choose any of optical microscopic images, SEM high-power images, SEM low-power images, and SEM high-definition images, and in the case of SEM, it is possible to display successive images and a single image. The SEM high-definition mode is a mode wherein the beam current is reduced to an extremely low level and definition is raised to a nanometer order. It is effective for acquiring the image of microscopic form defects. The map is brought into the specified mode and the die 34 is chosen. Upon selecting the die 34, the screen image changes to the screen image shown in FIG. 5 (corresponding to the die mode described above). The die 34 is enlarged to the whole screen, and as the magnification increases, the inspection area 41 specified separately is shown on the map displaying area 32. The display magnification of the map is changed as required, the image is confirmed as required, the specified point 42 is clicked to finalize the chosen state, the image acquisition button 43 is clicked to give an instruction to various units through the whole system controlling unit 15, the deflector 3 is scanned, the stage 6 is displaced, the defects are detected by the sensor 8 in keeping pace with the displacement of the stage, and the image information converted into digital signals by the AD converter 9 is stored in the memory 10.

Figure 6:
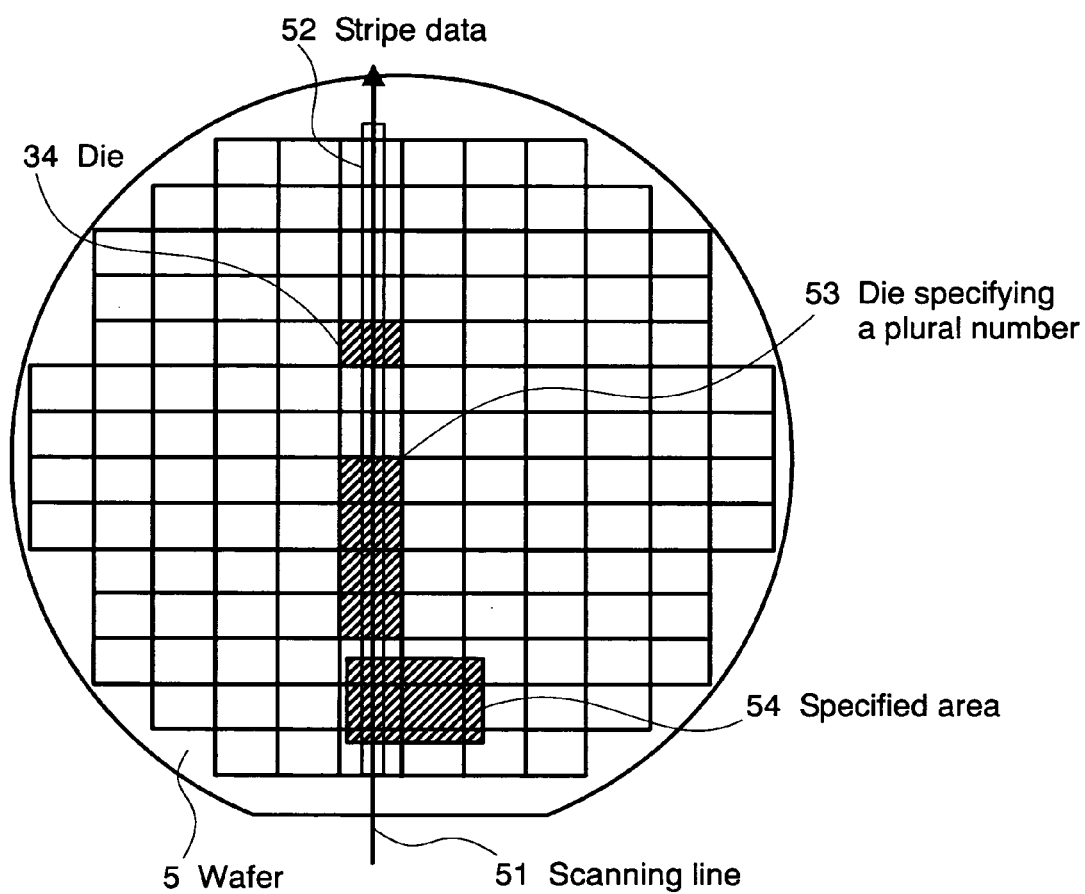
FIG. 6 is a top plan view of a wafer showing an example of specifying the test inspection area.

In general, the inspection is composed of the detection of the whole or a part of the striped areas 52 along the scanning line 51 shown in FIG. 6. The area acquired by the image acquisition button 43 enables to select all the stripes, an area necessary to output the defects of the specified die 34, an area necessary to output the defects of a plurality of specified dies 53, and area necessary to output the defects of the specified area 54.

By setting the conditions of sensibility, judgment and classification in the condition setting and result displaying area 45, and by clicking memory inspection button 44, the defects are judged in the image processing circuit 11 based on the image data stored in the memory 10, the partial images of the judged defects are stored in the partial image memory 12, their features are extracted in the partial image processing device 13, and they are classified and processed for the final determination of defects. After the completion of the defect determination, the process shifts to the screen image shown in FIG. 7.

Figure 5:
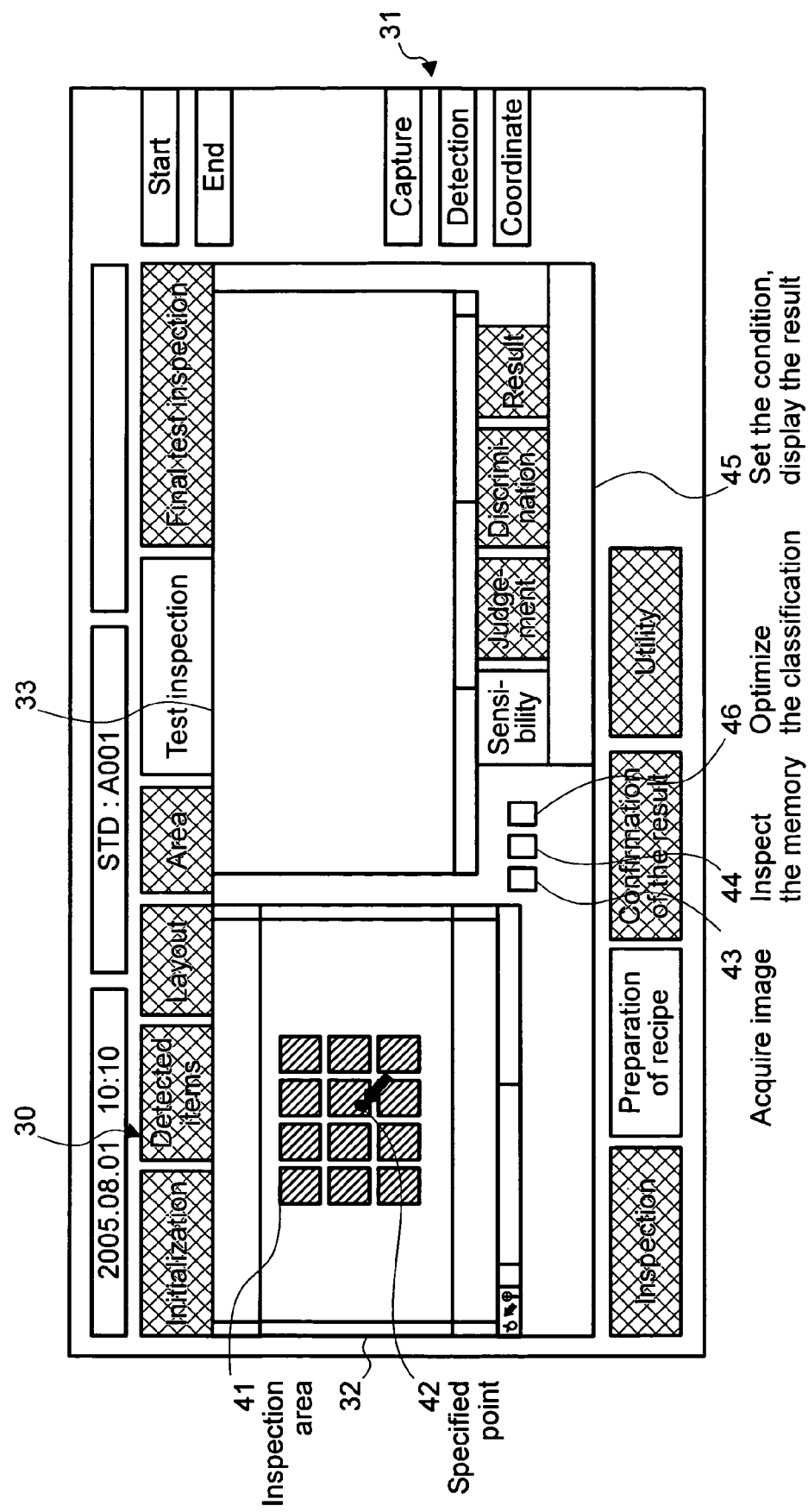
FIG. 5 is a front view of the die specified screen image of the test inspection GUI.
Figure 7:
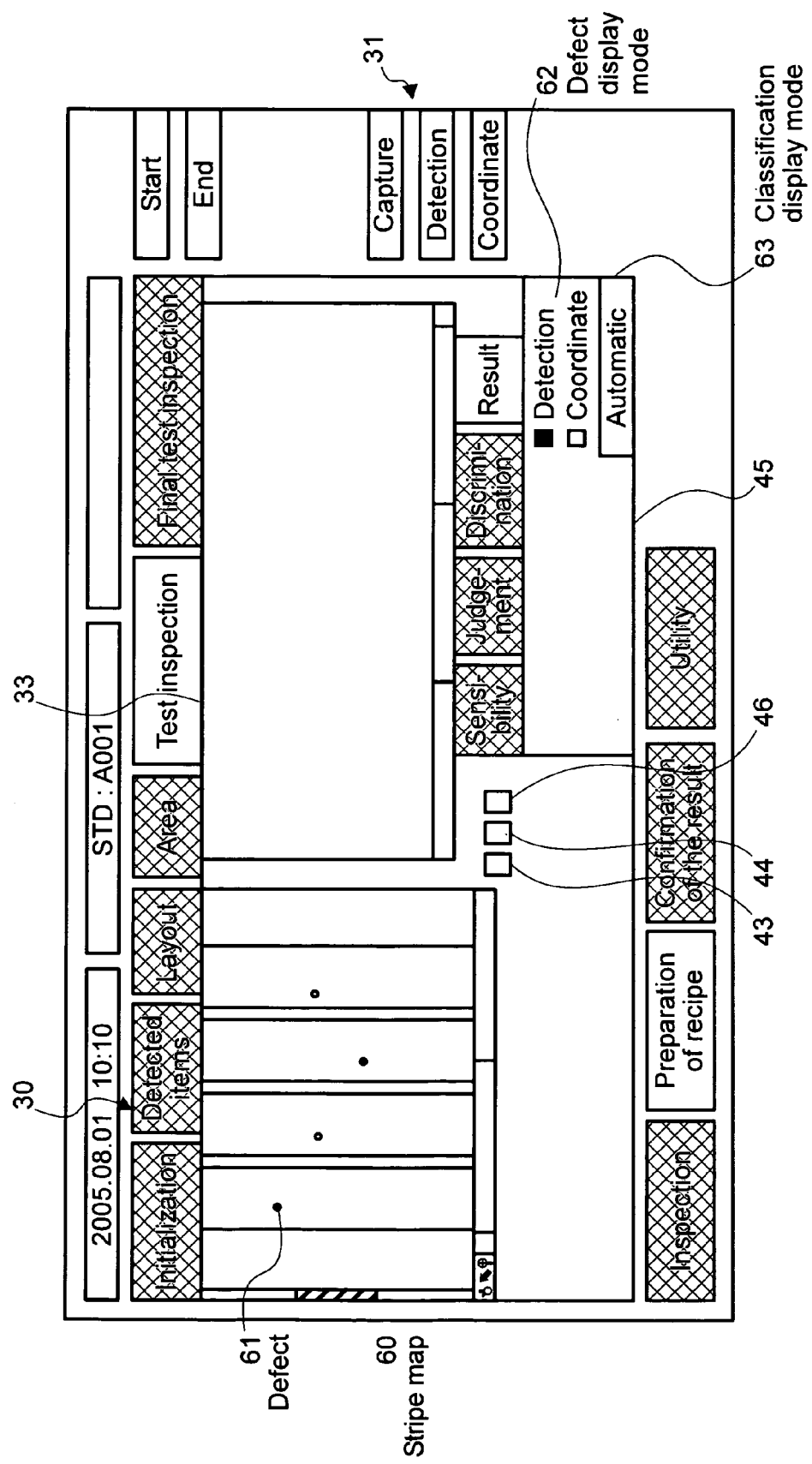
FIG. 7 is a front view of a screen image showing the inspection result of the test inspection GUI.

FIG. 7 is a drawing wherein the map 40 of FIG. 5 is replaced by the stripe map 60. The stripe map 60 represents strips of inspection area divided into four parts. Defects 61 are shown on the stripe map 60. Defects are shown in a form distinguishable by classification codes. When the map is brought into the selection mode and the defect is clicked, the image of the defect will be shown in the image display area 33. At the same time, if the result tab of the condition setting and result displaying area 45 is chosen, the features of the defect 61 including the classification result of the defect will be shown. By pressing on the defect display mode button 62, a selection will be made whether the image for inspection stored in the memory 10 is to be displayed on the image display area 33, or the stage 6 is to be displaced to the position of the defect and the defective image is to be displayed by reacquiring the image of the place. And by changing the classification display mode 63, it is possible to display either the classification code resulting from the automatic judgment of the classification display of the defect 61 displayed in the stripe map 60 or the classification code selected manually. And by specifying the classification display mode button 63, it is possible for example to switch the automatic classification code and the manual classification code at intervals of one second, or to display the automatic classification code and the manual classification code in a distinguishable form by different shapes and display colors. And now at the stage where the first inspection is terminated, the classification code is manually initialized to zero.

Based on the automatic classification code, manual classification code, and features displayed in the condition setting and result displaying area 45 of the defects 61 and the images displayed in the image display area 33, the manual classification code, the attributes of defects or the importance of the manual classification code displayed in the condition setting and result displaying area 45 are changed. The image data stored in the memory 10 after the change are judged again by using the image processing unit 11, the partial image memory 12 and the partial image processing unit 13. Or the partial images stored in the partial image memory 12 are again processed by using the partial image analyzing unit 13, or the defects are classified in the partial image, or the defects are judged and classified again by using a simulator having equivalent functions thereto. The defect judgment and classification conditions are set by repeating these operations. And the classification conditions for classifying optimally the manual classification codes are automatically calculated as required by pressing on the classification optimization button 46.

We will describe below in details the method of setting the defect judgment and classification conditions by means of test inspection. We will assume beforehand that the actual record value of the recipes of similar items or processes inspected in the past are set as default values. An example of details of setting defect judging sensibility and conditions related with sensibility and judgment is shown in FIG. 8. They include the methods of comparison (only comparison of cells, only comparison of dies, comparison of cells+comparison of dies), type of image filter used for the comparison of cells/comparison of dies, defect judgment threshold value for the comparison of cells/comparison of dies 70, conditions for the elimination of noises at the time of comparison of cells/comparison of dies, the condition for registering at the time of comparing dies, and the RIA condition for removing noises by taking advantage of repetitiveness at the time of comparing cells.

An example of defect classification conditions is shown in FIG. 9. The classification conditions include, by the order of priority of classification, automatic classification class 80, importance of the class 81, a plurality of features used to classify the defect among the features into the selected class and the limits of the feature amount. These conditions are adjusted as they are or based on the past know-how. After the adjustment, the images stored in the memory 10 by clicking the memory inspection button 44 in order to inspect the memory.

The defects 61 obtained as a result of the inspection are shown in the stripe map 60. The defects are confirmed in the order they are shown. An example of defect information is shown in FIG. 10. The automatic classification class 80 used for automatic classification, the method of comparison used for detection, the threshold value of the marginal comparison of cell and die for the detection of the defect, the area of defect, the X and Y projection length, the difference in shading, the light intensity of defects, the background light intensity, the texture of defects and the background texture are shown. In the process of the operations for the confirmation of defects, the manual classification class 91 and the importance of the defect 92 are inputted based on the defect image at the time of inspection or the defect information. Here, the importance is specified by taking the defect that should be set correctly at the time of resetting the conditions and at the time of automatic classification of class as the standard and by taking the importance (weight) of this defect as 1.0. By setting the importance at a high level, the possibility of identifying more correctly will be enhanced.

Figure 11:
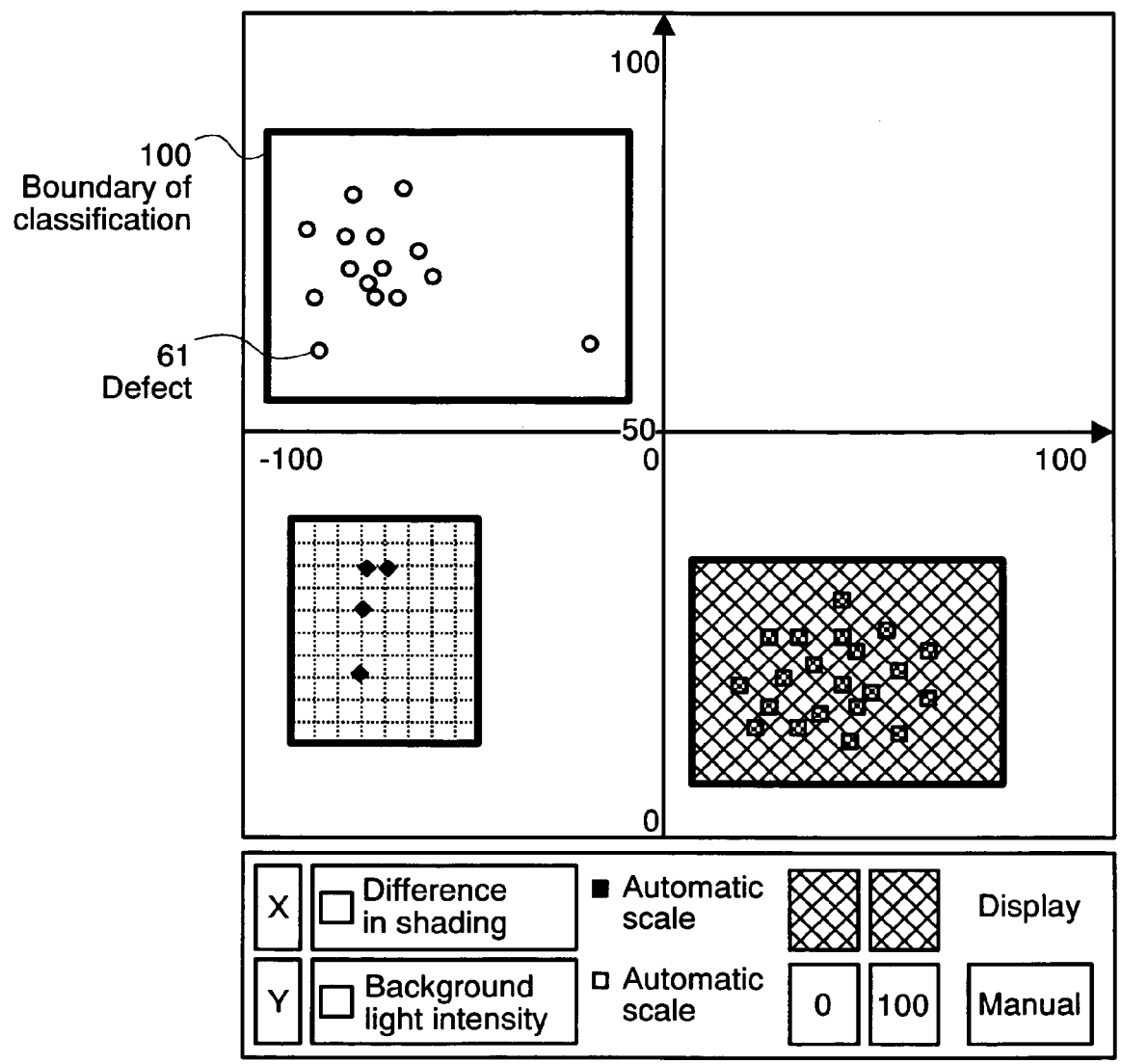
FIG. 11 is a front view of a screen image showing a feature amount map and for setting the classification boundary.

And at any time after the completion of the inspection, a feature amount map may be shown. An example of the feature amount map is shown in FIG. 11. The feature amount map shows which feature amount or classification class are allocated on the two axes of X and Y of the map. The map also allocates signals corresponding to the feature amount or the classification class of the defects and displays a map of defects. The selection by a click on the defect displayed leads to the display of the information in the condition setting and result displaying area 45 and the display of the image in the image display area 33. If the classification conditions shown in FIG. 9 are set, a separation boundary 100 will be shown on the features map. This separation boundary is set automatically or manually or manually corrected after it has been set automatically.

In the case of manual setting, it is set in the screen shown in FIG. 9. Or the displayed separation boundary 100 can be corrected by dragging the same. The manual classification and the importance of the defects are changed based on the information or the defect image displayed. The correct classification ratio is displayed by taking advantage of the reporting function. An example of report is shown in FIG. 12. In this example, the defect map and the number of defects automatically classified for each type of defect and their ratio, the number of confirmed defects and their ratio, the importance set for each class of classification, the number of confirmations for the confirmed defects among the classified defects, the number of accurate classifications found as a result of the confirmation and their ratio are displayed. And another example of report is shown in FIG. 13. In this example, the defect map and the number of defects automatically classified for each type of defect and their ratio, the number of confirmations for the defects confirmed among the classified defects, the importance set for each class of classification, the number of confirmed defects among the classified defects, accuracy ratio found as a result of its confirmation and its purity are displayed.

Figure 14:
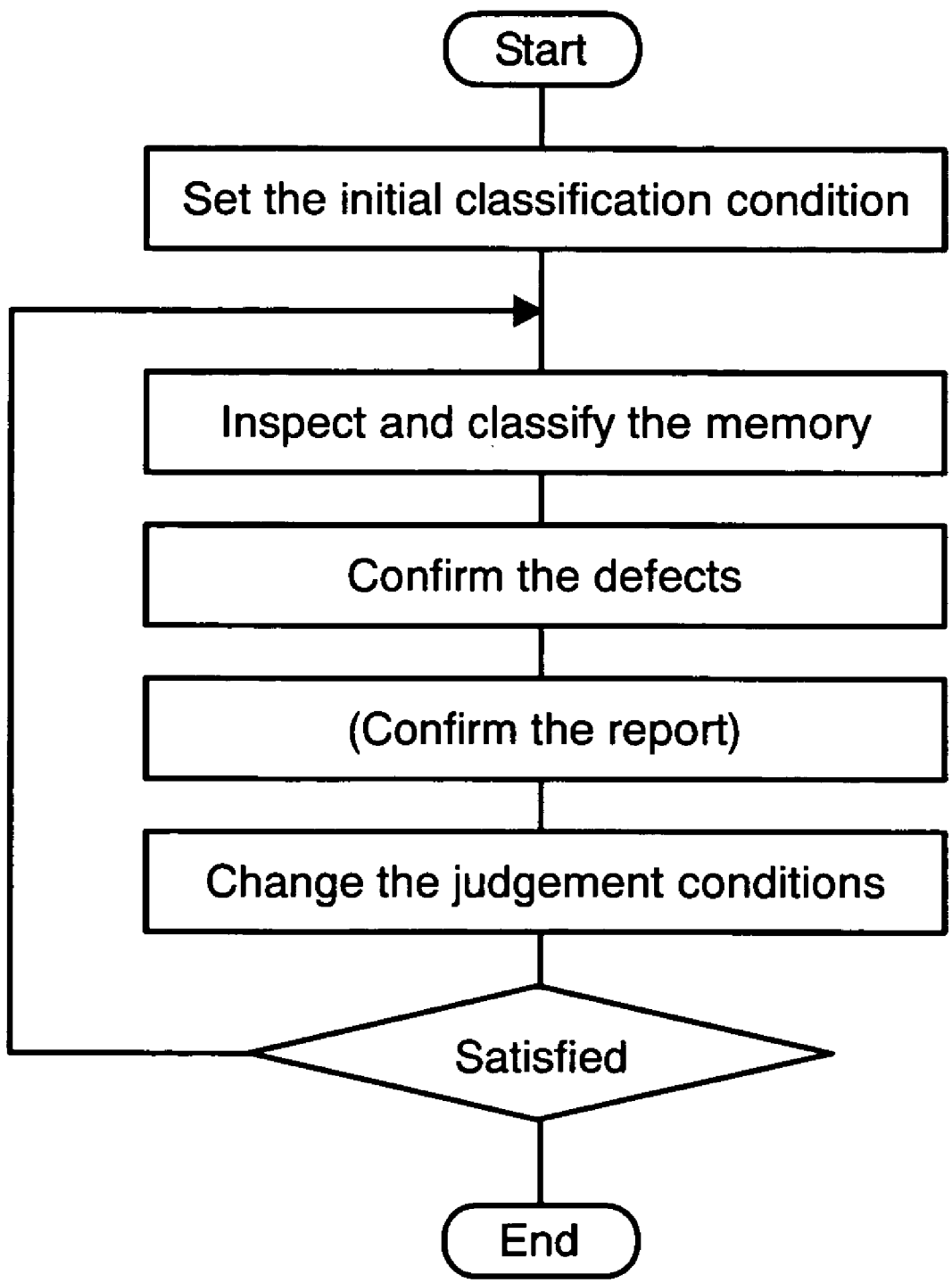
FIG. 14 is a flow diagram showing the procedure of manually setting the conditions for test inspections.

We will describe below the method of optimizing manually the sensibility, judgment and classification conditions. The flow diagram of manual optimization is shown in FIG. 14. The operator sets the value set in advance or the value adjusted by experience of the initial inspection condition in the condition setting and result displaying area 45. The operator inspects the memory 10 based on the image data stored in the memory to judge and classify defects. The defects 61 acquired are displayed in the stripe map 60, and the defect information is displayed in the form shown in FIG. 10 in the conditions setting and result displaying area 45. The manual classification class 91 is set based on this information. And the whole summary is confirmed by displaying a report screen image shown in FIG. 12 or FIG. 13 as required. And based on this information, conditions that seem to be more adequate are set anew in the screen image shown in FIG. 8 and FIG. 9. After the change, the memory inspection button 44 is clicked to judge again the image data stored in the memory 10 by operating the image processing unit 11, the partial image memory 12 and the partial image analyzing unit 13, or the partial images stored in the partial image memory 12 or the result storing unit 16 are judged and classified again by operating only the partial image analyzing unit 13 or the defect classification only, or the inspection result stored in the result storing unit 16 are judged and classified again by using a simulator performing similar works. The defect judgment and classification conditions are set by the repetition of these operations.

Figure 15:
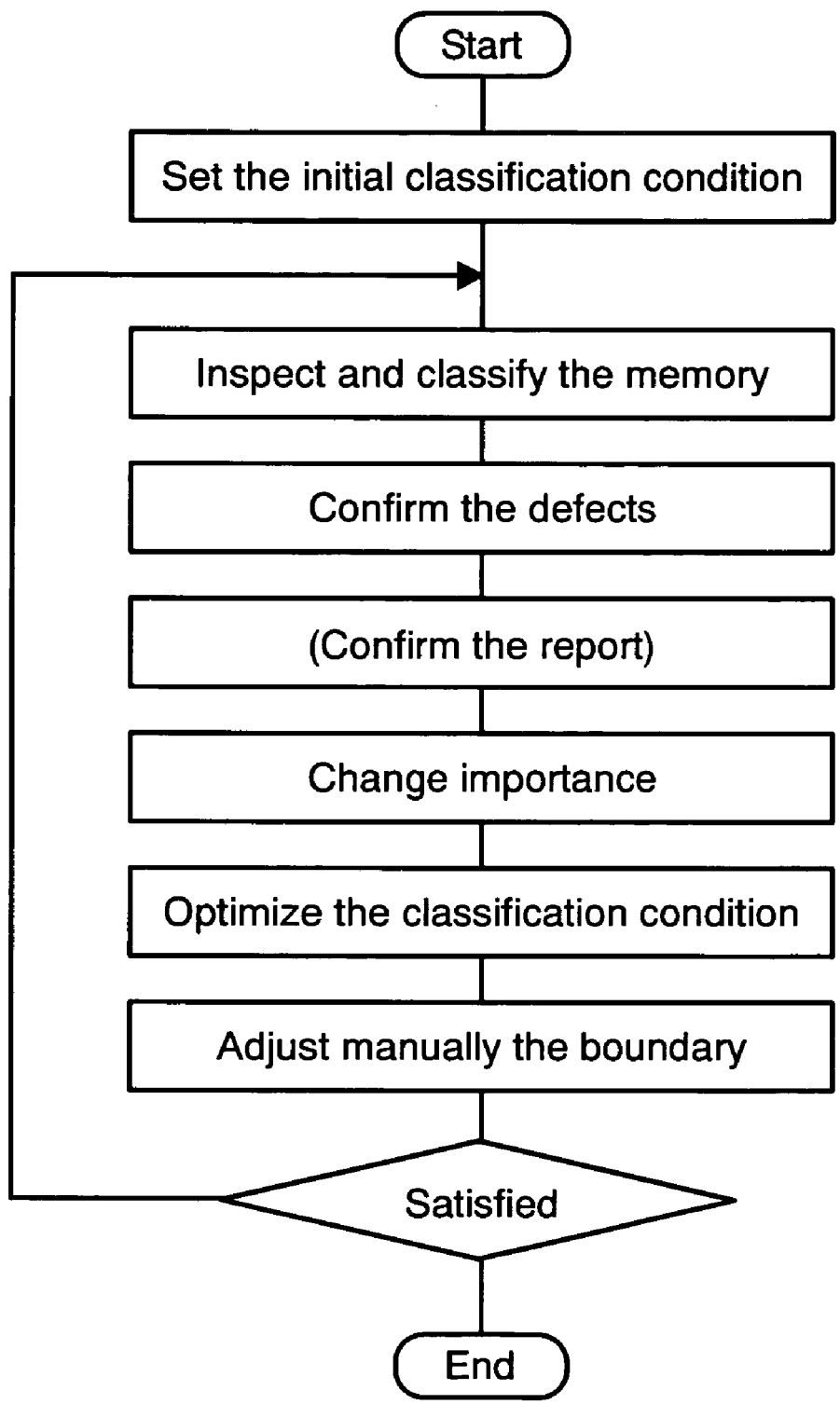
FIG. 15 is a flow diagram showing the procedure of automatically setting the conditions for test inspections.

We will describe below the method of optimizing automatically the sensibility, judgment and classification conditions. FIG. 15 shows a flow diagram of optimization. The operator sets the initial inspection condition at a predetermined value or a value adjusted by experience in the condition setting and result displaying area 45. The operator also inspects the memory 10 based on the image data stored in the memory and judges and classifies the defects. The defects acquired 61 are shown in the stripe map 60, and the defect information is shown in the condition setting and result displaying area 45 in the form shown in FIG. 10. Based on this information, the manual classification class 91, the importance of defect 92 and the importance of the class 81 are set. And the whole summary is confirmed by displaying the report screen image shown in FIG. 12 or FIG. 13 as required.

The defects of the image data stored in the memory 10 are judged and classified again after a change in weight by selecting the memory inspection button 44 and processing the image data with the help of the image processing unit 11, the partial image memory 12 and the partial image analyzing unit 13. Or the defects of the partial images stored in the partial image memory 12 are judged and classified again by operating only the partial image analyzing unit 13 or carrying out only a defect analysis or by using a simulator performing similar functions. And when the importance 92 of defects or the importance of the class 81 has been changed, the optimum classification condition is calculated by taking into account such importance by using the classification optimization button 46. The defect judgment and the classification conditions are set by the repetition of these operations. Obviously, it is possible to make a manual fine adjustment after an automatic optimization.

(2) Final Test Inspection (202)
(2-1) Inspection Over a Wide Area

Figure 16:
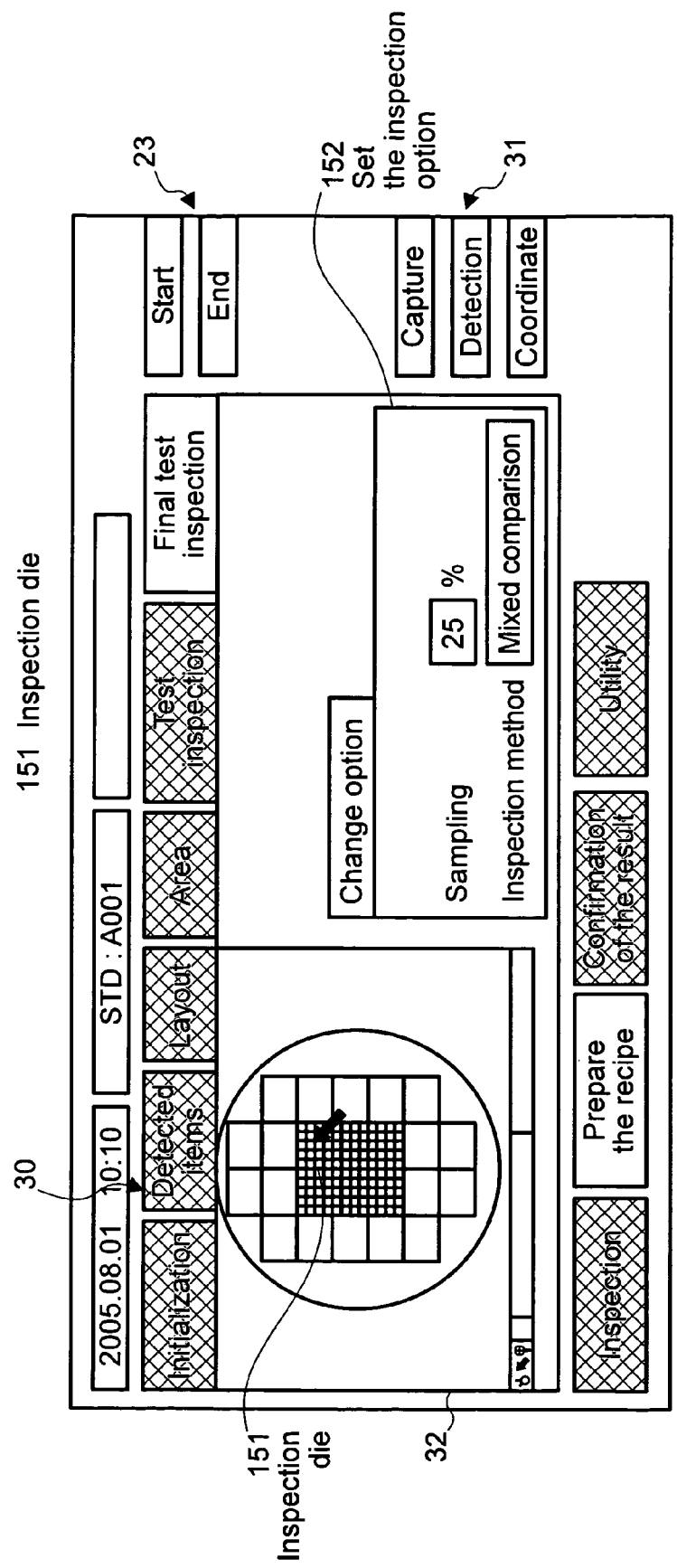
FIG. 16 is a front view of the GUI for specifying the inspection die for the final test inspection.
Figure 17:
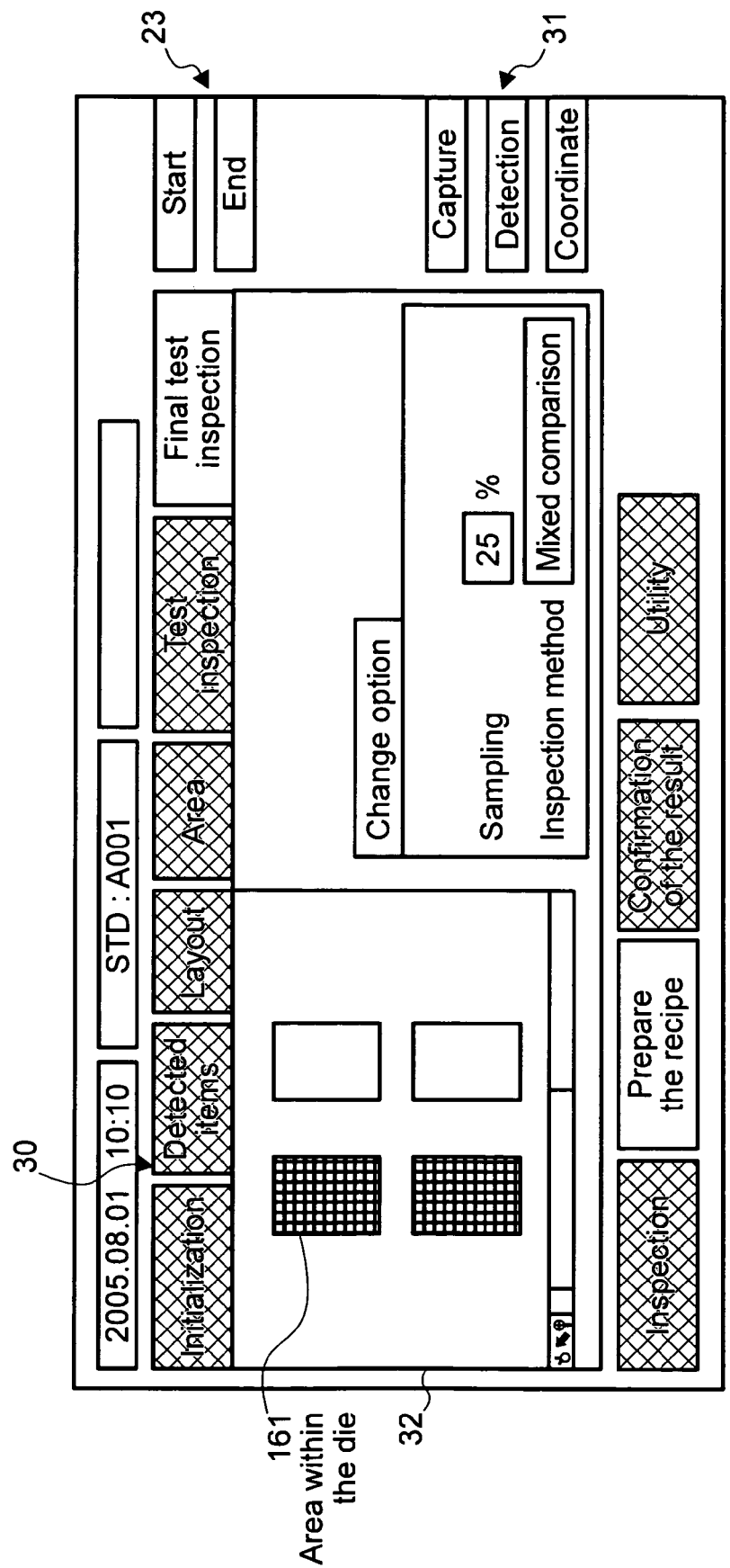
FIG. 17 is a front view of the GUI for specifying the die internal inspection area for the final test inspection.

When the inspection conditions are set in a test inspection, the final inspection of the operating procedure tab 122 is selected. This selection results in a shift of the screen image to the final test inspection initial screen image shown in FIG. 16. FIG. 16 shows the state wherein the final test inspection procedure has been selected. The initial screen image of the final test inspection is composed of a map displaying area 32 displaying and specifying the inspection dies 151 on the wafer 5, and the inspection option setting area 152. And by switching the map displaying area 32, and turning ON and OFF the area information set in advance on the screen image shown in FIG. 17, it is possible to display the inspection area 161 within the die wherein the possibility of implementing or not an inspection can be switched. After specifying the inspection die 151 and the inspection area 161 within the die, and after setting the inspection option in the inspection option setting area 152, the operation specifying button 23 is clicked to give an instruction for starting the inspection.

Figure 18:
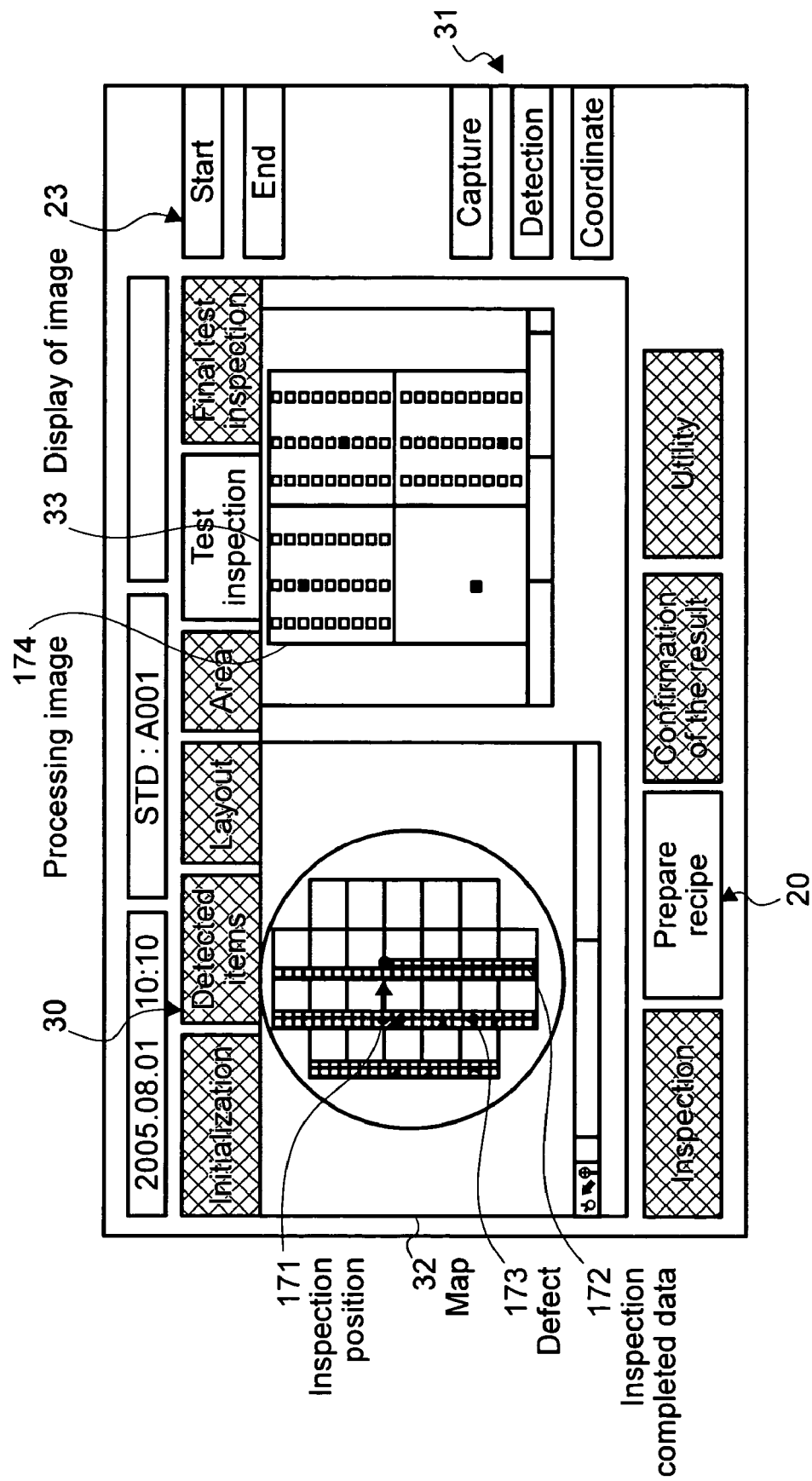
FIG. 18 is a front view of the GUI during inspection for the final test inspection.

When the inspection has started, the screen image under inspection shown in FIG. 18 is displayed. In the screen image under inspection, the inspection position 171 during the inspection, the inspected area 172 wherein an inspection has been completed and the defects 173 acquired during the process of inspection are respectively displayed on the map 32. And the partial image of the latest defects in the intermediary result of inspection and the processing image 174 including the result of defect judgment are displayed in the image display area 33. When the defects 173 are clicked, their processing images 174 can be displayed in the screen display area 33. And even during the inspection, it is possible to select the sensibility changing function by clicking the auxiliary function button 31 and to perform the inspection based on the selected threshold value (=sensibility). It makes possible to meet the change of a sensitivity during the inspection for the defects already detected by applying a newly set threshold value to the already detected defects and judging again as defects only those whose upper limit threshold value 93, which is one of the characteristic value of the defect, exceed the newly set threshold value. This additional judgment process enables to obtain the same results as those detected by the changed sensibility for the defects that had already been detected even if a change is made during the inspection. In addition, even during the inspection, it is possible to select the classification condition changing function and to perform the inspection based on the changed classification condition by selecting the auxiliary function button 31. In this case, the existing defects are classified again by using the feature amount of the defect. In this way, it will be possible to deal with changes in the classification conditions even during the inspection. We have so far described briefly changes in the sensibility and the classification condition, and we will describe in details on changes later after the inspection.

Figure 19:
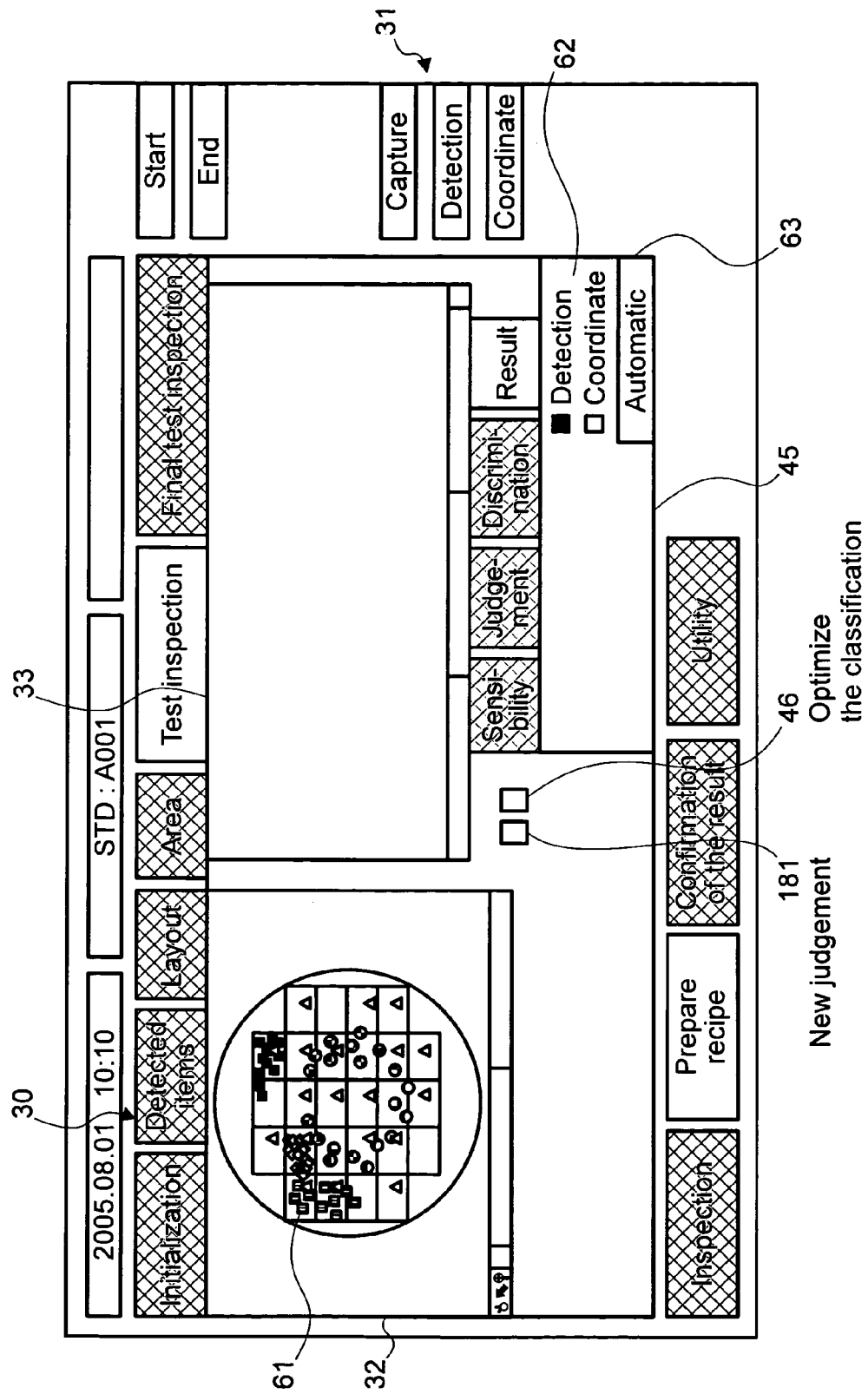
FIG. 19 is a front view of the review screen image.

After the inspection is completed, the screen image shifts to the end of inspection image (not shown), and the inspection result is displayed. The specification of review as required based on the inspection result causes a shift to the review screen image shown in FIG. 19.

(2-2) Review

The review screen image includes a map displaying area 32 indicating the defects 61 acquired as a result of the inspection, an image display area 33 displaying the image of defects specified by the map, a defect display mode specifying button 62 for switching the images to be displayed in the image display area, a classification mode specifying button 63 for switching the displays so that the defects displayed in the map displaying area 32 may be automatically classified, or manually classified or both or that the defects of different classification may be discriminable, a condition setting and result displaying area 45 for displaying the defect information resulting from the inspection, and a new judgment button 181 for judging again by changing the defect judgment sensibility or the classification condition.

Figure 20:
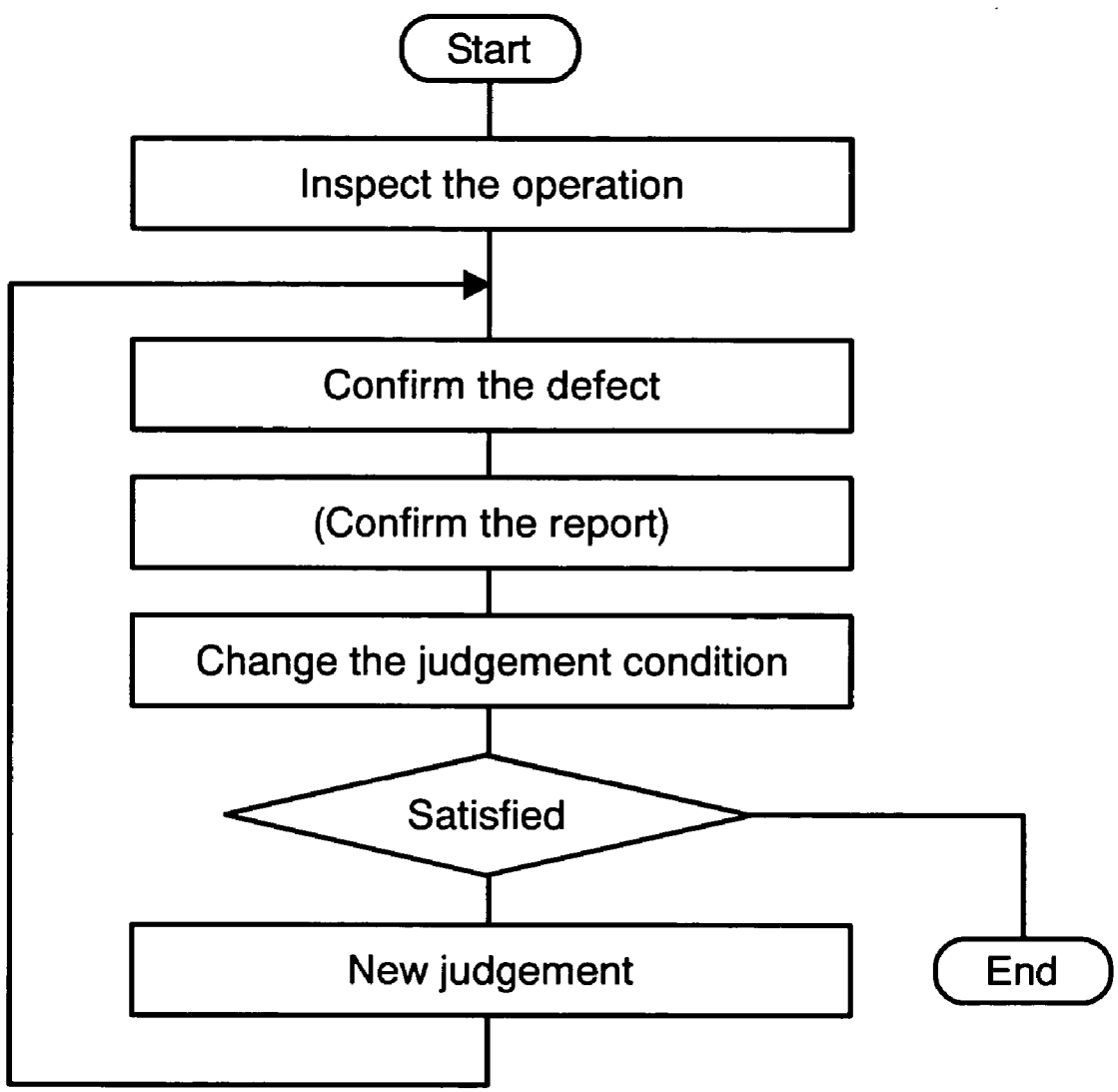
FIG. 20 is a flow diagram showing the procedure for manually setting the condition for the final test inspection.

We will now describe the method of optimizing manually the sensibility, judgment and classification conditions. The flow diagram of manual optimization is shown in FIG. 20. At the time of review, the defects 61 are displayed in the map displaying area 32, the defect information is shown in the condition setting and result displaying area 45, and the defect images are displayed in the image display area 33. Based on such information, the manual classification classes 91 are set. And the whole summary is confirmed as required by displaying a report screen image shown in FIG. 12 and FIG. 13. Based on such information, conditions that seem to be more suitable are reset in the screen image shown in FIG. 8 and FIG. 9.

As new judgments will be made on data stored in the partial image memory 10 or the result storing unit 16, changes in the positioning conditions for example are not valid and contain unchangeable parameters. Unchangeable parameters are shown by oblique lines and cannot be changed. Based on the partial images of defects stored in the partial image memory 12 or the result storing unit 16, defects are analyzed and classified by the defect analysis unit 13 or the simulator. Obviously, if the change in condition is limited to the classification condition and the sensibility condition, the defect analysis will not be carried out again. The repetition of these operations leads to the setting of the defect judgment and classification conditions.

Figure 21:
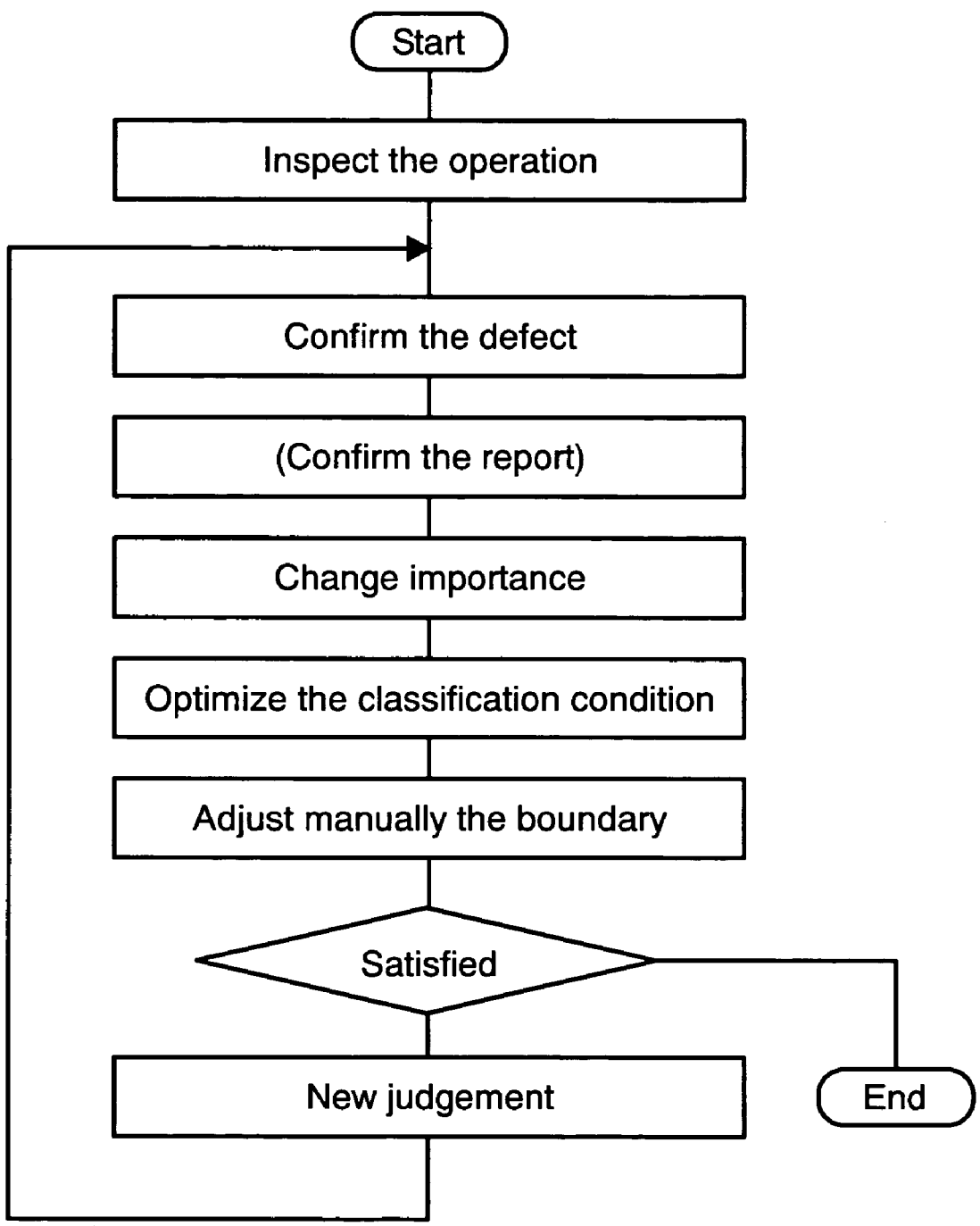
FIG. 21 is a flow diagram showing the procedure for automatically setting the condition for the final test inspection.

The following is the description of the method of optimizing automatically the sensibility, judgment and classification conditions. FIG. 21 shows a flow diagram of optimization. At the time of review, the defects 61 are displayed in the map displaying area 32, the defect information is shown in the condition setting and result displaying area 45, and the defect images are displayed in the image display area 33. Based on such information, the manual classification class 91, the importance of defects 92 and the importance of the class 81 are set. And the whole summary is confirmed as required by displaying a report screen image shown in FIG. 12 or FIG. 13. When the importance of defects 92 or the importance of class 81 has been changed, the optimum classification condition is calculated by taking into consideration this importance by clicking the classification optimizing button 46. By clicking the new judgment button 181 after the calculation of the optimum classification condition, the defect analysis and classification will be judged again. Obviously, it is possible to make manual fine adjustment after the automatic optimization. Here, we described a review immediately following an inspection. However, obviously the same procedure applies to the review mode after the end of an inspection and the inspection of a separate wafer. And although we omit description, it is needless to say that the same procedure applies to the review by a defect confirming apparatus different from the inspection apparatus.

According to this embodiment, as it is possible to store the inspection result, a review can be made even after a different wafer is inspected following the end of an inspection.

According to this embodiment, as the latest processing image is displayed during the inspection, or the processing image of the specified defect can be displayed, the progress of inspection can be correctly grasped and if necessary the inspection condition can be changed in the middle of the inspection or the inspection can be suspended.

According to this embodiment, as new inspections can be performed by using the same function as during the inspection or using a simulator thereof, the defects can be judged under different conditions without detecting images, and any failure of the inspection can be reduced.

According to this embodiment, any failure of the inspection can be reduced by changing the judgment sensibility or the classification conditions in the middle of the inspection if required.

According to this embodiment, as it is possible to store the inspection result, a review can be made even after a different wafer is inspected following the end of an inspection According to this embodiment, as the features amount of any defect contains a threshold value by which defects can be detected, it is possible to learn the defect that surfaced as a result of an inspection carried out under a different threshold value even after an inspection has ended.

According to this embodiment, as the classification conditions can be optimized, the conditions can be optimized even if the operator has no detailed knowledge of the classification conditions.

According to this embodiment, as the classification conditions can be finely adjusted manually after the optimization of the classification condition, the conditions can be marginally adjusted.

According to this embodiment, as it is possible to make adjustments by changing the importance of defects or the importance of class in the process of optimization of the classification conditions, the conditions can be optimized even if the operator has no detailed knowledge of the classification conditions.

Although we have described in details the embodiment of the present invention by limiting to the electron beam inspection. However, it is obviously needless to explain by showing concrete examples that this embodiment can be applied to apparatuses for inspecting circuit boards or for reviewing the inspection results.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A method of inspecting defects of a circuit pattern formed on a specimen comprising the steps of:
    taking images of a first area on the specimen on which the circuit pattern has been formed using an electron inspection apparatus and storing the images of the first area,
    processing the stored images of the first area using an image processing unit and setting inspection conditions and defect classification conditions,
    taking images successively in a second area wider than the first area on the specimen on which the circuit pattern has been formed and storing the images taken successively in the second area,
    processing the stored images taken successively in the second area to acquire a processing image including a defect judgment result acquired by taking successive images of the second area by using the inspection conditions and defect classification conditions which have been set,
    correcting the inspection conditions and the defect classification conditions to improve performance of detecting a defect of interest (DOI) based on the processing image including the defect judgment result, and
    inspecting successively the circuit patterns formed on the specimen and inspecting the defect of the circuit patterns by using the corrected inspection conditions and the corrected defect classification conditions.

2. The method of inspecting circuit patterns according to claim 1, wherein the image of defect acquired by processing the image of the second area by using the inspection conditions set together with the map information of defects on the specimen are displayed on the screen.

3. The method of inspecting circuit patterns according to claim 1, wherein the images of the specimen are acquired by irradiating and scanning the electron beam focused on the circuit patterns and by detecting synchronistically with the scanning the secondary electron radiating from the specimen as a result of the irradiation.

4. The method of inspecting circuit patterns according to claim 1, wherein the inspection conditions are corrected on the display screen.

5. The method of inspecting circuit patterns according to claim 1, wherein the inspection conditions are corrected by way of dialog on the display screen.

6. A method for inspecting defects of circuit patterns formed on a specimen comprising the steps of:
   taking images of a first area on the specimen on which the circuit pattern has been formed using an electron beam inspection apparatus and storing the images of the first area,
   processing the images of the first area using an image processing unit and setting inspection conditions and defect classification conditions,
   taking images in a second area on the specimen on which the circuit pattern has been formed and storing the images taken in the second area,
   processing the stored images taken in the second area to acquire a processing image including a defect judgment result by using the inspection conditions and defect classification conditions that have been set, and detecting defects,
   storing the images of the defects by taking images of the detected defects,
   correcting the inspection conditions and the defect classification conditions to improve performance of detecting a defect of interest (DOI) based on the processing image including the defect judgment result, and
   inspecting successively the circuit patterns formed on the specimen and inspecting the defect of the circuit patterns by using the corrected inspection conditions and the corrected defect classification conditions.

7. The method of inspecting circuit patterns according to claim 6, wherein the images of the specimen are acquired by irradiating and scanning the electron beam focused on the circuit patterns and detecting synchronistically with the scanning the secondary electron radiating from the specimen as a result of the irradiation.

8. The method of inspecting circuit patterns according to claim 6, wherein the inspection conditions are corrected by way of a dialog on the display screen.

9. An apparatus for inspecting defects comprising:
   an image acquiring means for acquiring images by taking image of the specimen on which the circuit patterns are formed,
   an image processing means for detecting the defects on the specimen by processing the image on the specimen acquired by image acquiring means and setting defect classification conditions, and
   a condition setting means for setting the image processing conditions of the image processing means,
   wherein the condition setting means sets the sensibility of judging defect and the defect classification conditions according to the type of defect and the importance of information desired to be detected,
   wherein the image processing means processes stored images to acquire a processing image which includes a defect judgment result based on the defect classifications, and
   wherein the image processing means corrects inspection conditions and the defect classification conditions to improve detection of a defect of interest (DOI) based on the processing image including the defect judgment result.

10. The apparatus for inspecting circuit patterns according to claim 9 wherein the image acquiring means comprises an electron beam irradiating unit for scanning by irradiating electron beams focused on the circuit pattern, a secondary electron detecting unit detecting synchronistically with the scanning the secondary electrons radiating from the specimen on which the electron beams irradiating unit irradiated electron beams, and an image acquiring unit for acquiring images on the specimen from signals acquired by detecting secondary electrons by the secondary electron beam detecting unit.

11. The apparatus for inspecting circuit patterns according to claim 9 wherein the condition setting means comprises a display screen, and sets the image processing conditions of the image processing means on the display screen.

12. The apparatus for inspecting circuit patterns according to claim 9 wherein the condition setting means sets the image processing conditions including the defect judging conditions for judging defects from the images acquired by the image acquiring means and the defect classifying conditions for classifying the judged defects by type.

* * * * *